United States Patent
Tamaki et al.

(10) Patent No.: US 9,853,200 B2
(45) Date of Patent: Dec. 26, 2017

(54) (ZR,HF)$_3$NI$_3$SB$_4$-BASED N-TYPE THERMOELECTRIC CONVERSION MATERIAL

(71) Applicant: Panasonic Corporation, Osaka (JP)

(72) Inventors: Hiromasa Tamaki, Osaka (JP); Tsutomu Kanno, Kyoto (JP); Akihiro Sakai, Nara (JP); Kohei Takahashi, Osaka (JP); Hideo Kusada, Osaka (JP); Yuka Yamada, Nara (JP)

(73) Assignee: PANASONIC CORPORATION, Osaka (JP)

( * ) Notice: Subject to any disclaimer, the term of this patent is extended or adjusted under 35 U.S.C. 154(b) by 233 days.

(21) Appl. No.: 14/718,491

(22) Filed: May 21, 2015

(65) Prior Publication Data

US 2015/0255695 A1 Sep. 10, 2015

Related U.S. Application Data

(63) Continuation of application No. PCT/JP2014/001885, filed on Mar. 31, 2014.

(30) Foreign Application Priority Data

Jul. 22, 2013 (JP) .................. 2013-151589

(51) Int. Cl.
*H01L 35/18* (2006.01)
*H01L 35/20* (2006.01)
(Continued)

(52) U.S. Cl.
CPC .............. *H01L 35/18* (2013.01); *B22F 3/105* (2013.01); *B22F 3/14* (2013.01); *C22C 1/02* (2013.01);
(Continued)

(58) Field of Classification Search
CPC C22C 5/04; C22C 12/00; C22C 16/00; C22C 27/02; C22C 28/00; C22C 30/00; C22C 30/02
See application file for complete search history.

(56) References Cited

U.S. PATENT DOCUMENTS

2007/0125416 A1 6/2007 Iwanade et al.
2009/0038667 A1 2/2009 Hirono et al.

FOREIGN PATENT DOCUMENTS

JP 2005-286228 10/2005
JP 2007-158191 6/2007
(Continued)

OTHER PUBLICATIONS

International Preliminary Report on Patentability dated Oct. 6, 2015 in International Application No. PCT/JP2014/001882.
(Continued)

*Primary Examiner* — Scott Kastler
*Assistant Examiner* — Vanessa Luk
(74) *Attorney, Agent, or Firm* — Wenderoth, Lind & Ponack, L.L.P.

(57) ABSTRACT

An n-type thermoelectric conversion material expressed in a chemical formula $X_{3-x}X'_xT_{3-y}Cu_ySb_4$ ($0 \leq x < 3$, $0 \leq y < 3.0$, and $x+y>0$), the X includes one or more element(s) of Zr and Hf, the X' includes one or more element(s) of Nb and Ta, and the T includes one or more element(s) selected from Ni, Pd, and Pt, while including at least Ni, the n-type thermoelectric conversion material expressed in the chemical formula $X_{3-x}X'_xT_{3-y}Cu_ySb_4$ has symmetry of a cubic crystal belonging to a space group I-43d.

12 Claims, 8 Drawing Sheets

(51) Int. Cl.

| | |
|---|---|
| *C22C 12/00* | (2006.01) |
| *B22F 3/14* | (2006.01) |
| *F27D 11/08* | (2006.01) |
| *B22F 3/105* | (2006.01) |
| *C22C 1/04* | (2006.01) |
| *C22C 1/02* | (2006.01) |
| *C22C 27/00* | (2006.01) |
| *C22C 30/02* | (2006.01) |
| *H01L 35/34* | (2006.01) |

(52) U.S. Cl.
CPC .............. *C22C 1/04* (2013.01); *C22C 1/0483* (2013.01); *C22C 12/00* (2013.01); *C22C 27/00* (2013.01); *C22C 30/02* (2013.01); *F27D 11/08* (2013.01); *H01L 35/20* (2013.01); *H01L 35/34* (2013.01); *B22F 2003/1051* (2013.01)

(56) References Cited

FOREIGN PATENT DOCUMENTS

| | | |
|---|---|---|
| JP | 2009-74106 | 4/2009 |
| JP | 2009-81178 | 4/2009 |
| JP | 2009-81287 | 4/2009 |
| KR | 1020110079490 | 8/2012 |
| WO | 2007/063755 | 6/2007 |

OTHER PUBLICATIONS

International Preliminary Report on Patentability dated Oct. 6, 2015 in International Application No. PCT/JP2014/001883.
International Search Report dated Jul. 1, 2014 in International (PCT) Application No. PCT/JP2014/001885.
International Search Report dated Jul. 1, 2014 in International (PCT) Application No. PCT/JP2014/001882.
International Search Report dated Jul. 1, 2014 in International (PCT) Application No. PCT/JP2014/001883.
J. R. Salvador et al., "Synthesis and Transport Properties of $M_3Ni_3Sb_4$ (M=Zr and Hf): An Intermetallic Semiconductor", Physical Review, vol. 77, pp. 235217-1-235217-8, 2008.
P. Larson, "Electronic Structure of the Ternary Zintl-Phase Compounds $Zr_3Ni_3Sb_4$, $Hf_3Ni_3Sb_4$, and $Zr_3Pt_3Sb_4$ and Their Similarity to Half-Heusler Compounds such as ZrNiSn", Physical Review, vol. 74, pp. 035111-1-035111-8, 2006.
International Preliminary Report on Patentability dated Jan. 28, 2016 in International Application No. PCT/JP2014/001885.
Office Action dated Oct. 19, 2017 in U.S. Appl. No. 14/847,362.

(ZR,HF)₃NI₃SB₄-BASED N-TYPE THERMOELECTRIC CONVERSION MATERIAL

CROSS-REFERENCE TO RELATED APPLICATIONS

This is a continuation application of International Application No. PCT/JP2014/001885, with an international filing date of Mar. 31, 2014, which claims priority of Japanese Patent Application No. 2013-151589 filed on Jul. 22, 2013, the contents of which is incorporated herein by reference.

BACKGROUND OF THE INVENTION (1) Field of the Invention

This disclosure relates to an n-type thermoelectric conversion material of a (Zr,Hf)$_3$Ni$_3$Sb$_4$-based thermoelectric conversion material for use in thermoelectric generation or thermoelectric cooling.

(2) Description of Related Art

Thermoelectric generation is a technique of directly converting thermal energy into electric energy by using a Seebeck effect, that is, a thermal electromotive force generated between the ends of a material in proportion to a temperature difference when the temperature difference is set between the ends of the material. This technique is put into practical use in part as a remote-area electric power source, an outer-space electric power source, a military-use electric power source, etc. Thermoelectric cooling is a technique that uses a Peltier effect, that is, a phenomenon that electrons carried by a current move heat. For example, the thermoelectric cooling is a technique of, when two materials each including electric conduction carriers having a polarity different from that of electric conduction carriers of the other material are connected in thermally parallel and in electrically series and a current is caused to flow through the materials, absorbing heat in the connection portion therebetween by using the fact that the difference in the polarity between the electric conduction carriers (carriers) reflects on the difference in the direction of a heat flow.

A (Zr,Hf)$_3$Ni$_3$Sb$_4$-based n-type thermoelectric conversion material is described in J. R. Salvador, X. Shi, J. Yang, and H. Wang, "Synthesis and transport properties of M$_3$Ni$_3$Sb$_4$ (M=Zr and Hf): An intermetallic semiconductor", Physical Review B 77, 235217, Jun. 27, 2008 (called as Non-Patent Literature 1).

SUMMARY

For the traditional (Zr,Hf)$_3$Ni$_3$Sb$_4$-based thermoelectric conversion material, only a p-type thermoelectric conversion property has been realized and no n-type thermoelectric conversion property has been realized.

One non-limiting and exemplary embodiment provides an n-type thermoelectric conversion material of the (Zr,Hf)$_3$Ni$_3$Sb$_4$-based thermoelectric conversion material.

In one general aspect, the techniques disclosed here feature: an n-type thermoelectric conversion material expressed in a chemical formula X$_{3-x}$X'$_x$T$_{3-y}$Cu$_y$Sb$_4$ (0≤x<3, 0≤y<3.0, and x+y>0), wherein the X comprises one or more element(s) of Zr and Hf,
the X' comprises one or more element(s) of Nb and Ta,
the T comprises one or more element(s) selected from Ni, Pd, and Pt, while including at least Ni and the material expressed in the chemical formula X$_{3-x}$X'$_x$T$_{3-y}$Cu$_y$Sb$_4$ has symmetry of a cubic crystal belonging to a space group I-43d.

These general and specific aspects may be implemented using a system, a method, and a computer program, and any combination of systems, methods, and computer programs.

The n-type thermoelectric conversion material according to this disclosure is expressed in a chemical formula X$_{3-x}$X'$_x$T$_{3-y}$Cu$_y$Sb$_4$ (0≤x<3, 0≤y<3.0, and x+y>0) and the n-type thermoelectric conversion property can be realized by this material system by replacing a portion of Ni with Cu.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1:
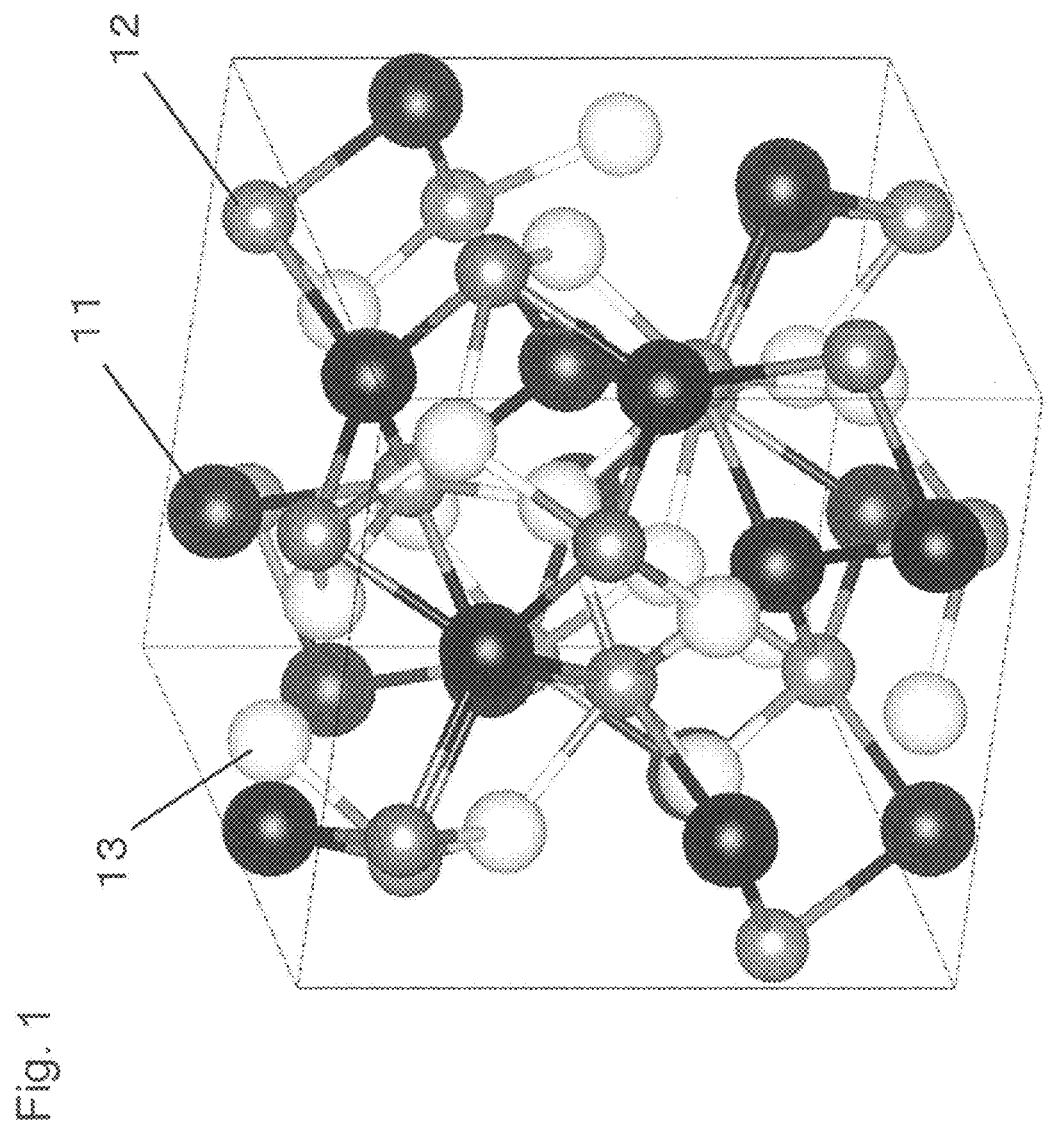
FIG. 1 is a schematic diagram of a crystalline structure of X$_{3-x}$X'$_x$T$_{3-y}$Cu$_y$Sb$_4$ that is a thermoelectric conversion material of this disclosure.

According to a first aspect, an n-type thermoelectric conversion material expressed in a chemical formula X$_{3-x}$X'$_x$T$_{3-y}$Cu$_y$Sb$_4$ (0≤x<3, 0≤y<3.0, and x+y>0), wherein the X comprises one or more element(s) of Zr and Hf,
the X' comprises one or more element(s) of Nb and Ta,
the T comprises one or more element(s) selected from Ni, Pd, and Pt, while including at least Ni and
the material expressed in the chemical formula $X_{3-x}X'_xT_{3-y}Cu_ySb_4$ has symmetry of a cubic crystal belonging to a space group l-43$d$.

Further, as an n-type thermoelectric conversion material of a second aspect, in the first aspect, a total of the x and the y may be in a range $0.05 \leq x+y \leq 1.1$.

Further, as an n-type thermoelectric conversion material of a third aspect, in the first aspect, the total of the x and the y may be in a range $0.05 \leq x+y \leq 0.7$.

Further, as an n-type thermoelectric conversion material of a fourth aspect, in the first aspect, the total of the x and the y may be in a range $0.2 \leq x+y \leq 0.5$.

Further, as an n-type thermoelectric conversion material of a fifth aspect, in the first aspect, the x may be zero.

According to a sixth aspect, a production method of an n-type thermoelectric conversion material, including:

(1) a first step of weighing raw materials comprising one or more element(s) (X) of Zr and Hf, one or more element(s) (X') of Nb and Ta, and one or more element(s) (T) selected from Ni, Pd, and Pt, while including at least Ni, Cu, and Sb for amounts corresponding to stoichiometric ratios in a chemical formula $X_{3-x}X'_xT_{3-y}Cu_ySb_4$ ($0 \leq x < 3$, $0 \leq y < 3$, and x+y>0), the material expressed in the chemical formula $X_{3-x}X'_xT_{3-y}Cu_ySb_4$ having symmetry of a cubic crystal belonging to a space group I-43d;

(2) a second step of acquiring an alloy "A" by alloying the raw materials that comprise the selected elements of Zr,Hf, Nb, Ta, Ni, Pd, Pt, and Cu; and (3) a third step of acquiring the n-type thermoelectric conversion material that comprises an alloy B, by melting and cooling the acquired alloy A and the raw material comprising Sb.

Further, as a production method of an n-type thermoelectric conversion material of a seventh aspect, in the sixth aspect, the third step may be executed at a temperature lower than a temperature at which the second step is executed.

Further, as a production method of an n-type thermoelectric conversion material of a eighth aspect, in the sixth aspect, at the second step, the alloy A may be acquired by melting the raw materials at a temperature equal to or higher than 2,200° C. in an Ar atmosphere using an arc melting method and cooling the melted raw materials therein.

Further, as a production method of an n-type thermoelectric conversion material of a ninth aspect, in the sixth aspect, at the third step, the alloy B may be acquired by melting the alloy A and the raw material comprising Sb at a temperature from 1,200 to 1,500° C. in an Ar atmosphere using the arc melting method, and cooling the melted alloy A and the raw material therein.

Further, as a production method of an n-type thermoelectric conversion material of a tenth aspect, in the sixth aspect, further, a fourth step of compacting the alloy B may be included.

Further, as a production method of an n-type thermoelectric conversion material of a eleventh aspect, in the tenth aspect, the fourth step may include:

(a) acquiring powder of the alloy B by pulverizing the alloy B and mixing;

(b) filling a die with the powder of the alloy B and introducing the die into a vacuum of one Pa or lower;

(c) applying a pressure in a range from 10 MPa to 100 MPa to a specimen covered by the die from above and underneath and increasing a temperature of the specimen up to a temperature in a range from 750° C. to 900° C. maintaining the pressure; and (d) cooling the specimen to a room temperature.

Further, as a production method of an n-type thermoelectric conversion material of a twelfth aspect, in the sixth aspect, the x may be zero.

An n-type thermoelectric conversion material and a production method thereof according to an embodiment of this disclosure will be described below with reference to the drawings.

First Embodiment $X_{3-x}X'_xT_{3-y}Cu_ySb_4$ ($0 \leq x < 3$, $0 \leq y < 3.0$, and x+y>0) will be described that is the n-type thermoelectric conversion material according to a first embodiment of this disclosure. "X" includes one or more element(s) of Zr and Hf. "X" includes one or more element(s) of Nb and Ta. "T" includes one or more element(s) selected from Ni, Pd, and Pt, while including at least Ni. The compound $X_{3-x}X'_xT_{3-y}Cu_ySb_4$ has symmetry of a cubic crystal belonging to a space group l-43$d$. FIG. 1 is a schematic diagram of the crystalline structure of $X_{3-x}X'_xT_{3-y}Cu_ySb_4$. As depicted in FIG. 1, $X_{3-x}X'_xT_{3-y}Cu_ySb_4$ takes a crystalline structure that has atoms disposed in each unit cell at ratios of Zr+Hf+Nb+Ta:Ni+Pd+Pt+Cu:Sb=3:3:4.

The energy conversion efficiency between heat and electricity in thermoelectric generation or thermoelectric cooling is determined based on a performance index ZT of a material used therein. Using a Seebeck coefficient S of the thermoelectric conversion material, the electric resistivity ρ thereof, the thermal conductivity κ thereof, and the absolute temperature T of the evaluation environment, the performance index ZT is expressed as $ZT=S^2T/\rho\kappa$. The energy conversion efficiency is higher as the performance index ZT is higher. A semiconductor having electric conduction carriers injected therein often realizes a high performance index ZT. The fact that the semiconductor has a low thermal conductivity κ is therefore an desirable condition for realizing the high performance index ZT.

$X_3Ni_3Sb_4$ (X=Zr,Hf) as one of the semiconductors each having a low thermal conductivity κ is proposed as a candidate of a thermoelectric material. For example, Non-Patent Literature 1 describes that the thermal conductivity κ at the room temperature is 4.3 W/m·K when X is X=Zr, and is 2.7 W/m·K when X is X=Hf.

Figure 3:
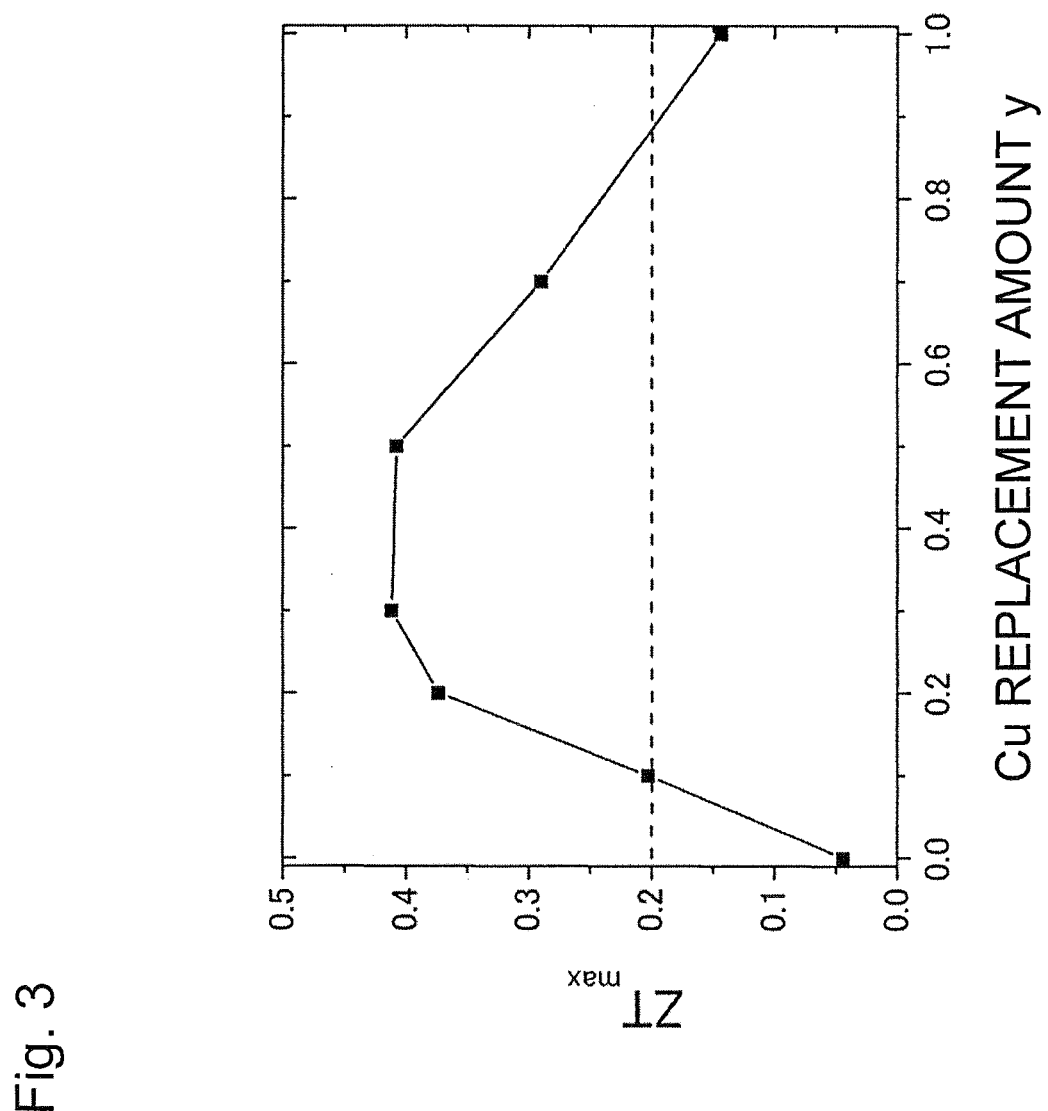
FIG. 3 is a graph of Cu replacement amount dependency of a maximal value ZT$_{max}$ of a performance index of X$_3$T$_{3-y}$Cu$_y$Sb$_4$ that is the thermoelectric conversion material of this disclosure.
Figure 4:
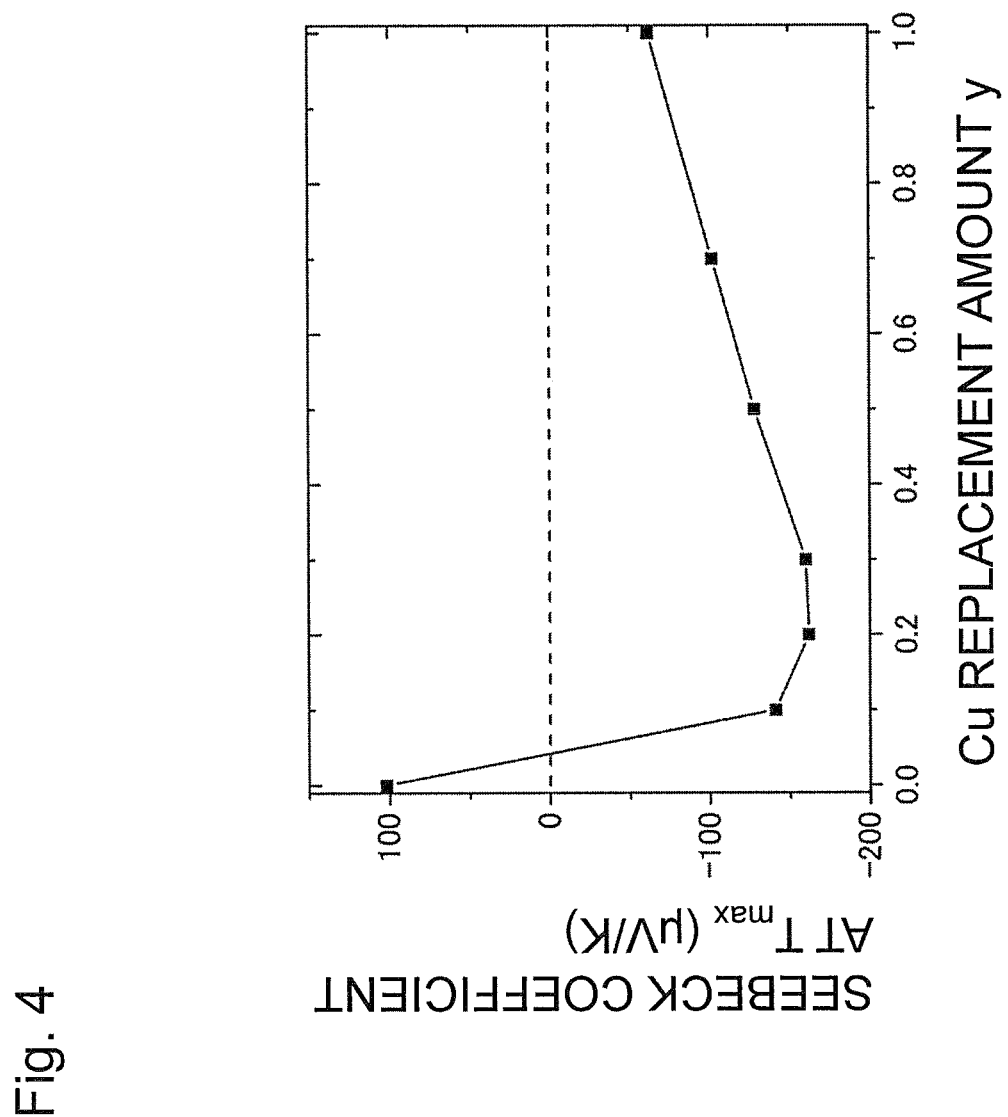
FIG. 4 is a graph of Cu replacement amount dependency of a Seebeck coefficient at a temperature T$_{max}$ at which the performance index becomes maximal of X$_3$T$_{3-y}$Cu$_y$Sb$_4$ that is the thermoelectric conversion material of this disclosure.

According to the thermoelectric conversion material expressed in the chemical formula $X_{3-x}X'_xT_{3-y}Cu_ySb_4$ ($0 \leq x < 3$, $0 \leq y < 3.0$, and x+y>0) of the first embodiment of this disclosure, the thermoelectric conversion material is enabled to show an n-type thermoelectric conversion property by using Zr or Hf as "X" and replacing with Cu a portion of "T" including the one or more element(s) selected from Ni, Pd, and Pt, while including at least Ni. For example, as shown in Table 1 and as depicted in FIG. 4 described later, it was able to be confirmed that setting the value of "y" to be in a range $0.05 \leq y \leq 1.1$ caused the n-type thermoelectric conversion property to be shown. As described later, taking into consideration the Cu replacement amount dependency of the performance index ZT depicted in FIG. 3 and the Cu replacement amount dependency of the Seebeck coefficient depicted in FIG. 4, setting the value of "y" to be in a range $0.05 \leq y \leq 0.7$ can concurrently realize the n-type thermoelectric conversion property, a high performance index, and a Seebeck coefficient having a great absolute value. Setting the value of "y" to be in a range $0.2 \leq y \leq 0.5$ enables a higher performance index and a Seebeck coefficient having a greater absolute value to be acquired. The value of "y" is the Cu replacement amount in the prepared composition.

The n-type thermoelectric conversion property is also enabled to show by replacing "X" including the one or more element(s) of Zr and Hf with "X" including the one or more element(s) of Nb and Ta. For example, as shown in Table 1 and as depicted in FIGS. 6 and 8 described later, it was able to be confirmed that setting the replacement amount "x" of "X" to be 0.05≤x≤0.7 caused the n-type thermoelectric conversion property to be shown. As described later, taking into consideration the Nb replacement amount dependency and the Ta replacement amount dependency of the performance index ZT depicted in FIGS. 5 and 7, and the Nb replacement amount dependency and the Ta replacement amount dependency of the Seebeck coefficient depicted in FIGS. 6 and 8, setting the value of "x" to be in a range 0.05≤x≤0.7 can concurrently realize the n-type thermoelectric conversion property, a high performance index, and a Seebeck coefficient having a great absolute value. Setting the value of "x" to be in a range 0.1≤x≤0.5 enables a higher performance index and a Seebeck coefficient having a greater absolute value to be acquired. The value of "x" is the replacement amount of Nb or Ta in the prepared composition.

The n-type thermoelectric conversion material according to the first embodiment of this disclosure can be combined with a p-type thermoelectric conversion material especially of the $(Zr,Hf)_3Ni_3Sb_4$-based thermoelectric conversion material to constitute a device. The device can be constituted by combining the p-type and the n-type $(Zr,Hf)_3Ni_3Sb_4$-based thermoelectric conversion materials with each other both having the same base, and, for example, the mechanical properties can therefore be matched with each other for the overall device.

Figure 2:
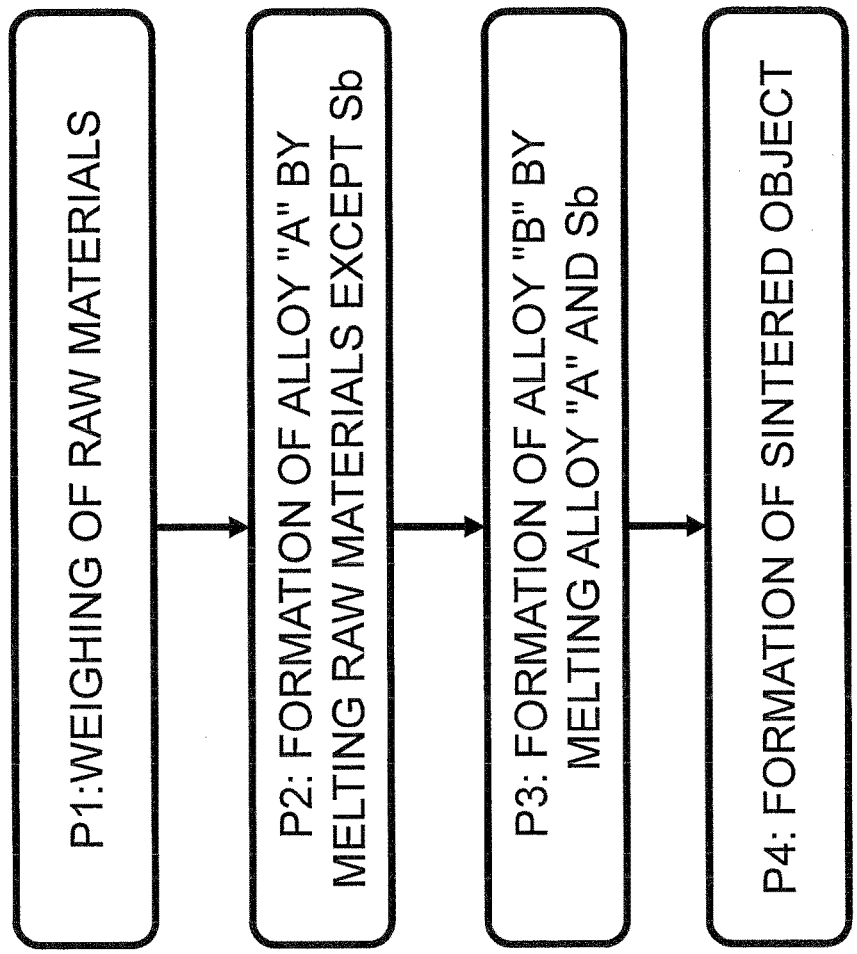
FIG. 2 is a schematic diagram of an example of a procedure for producing X$_{3-x}$X'$_x$T$_{3-y}$Cu$_y$Sb$_4$ that is the thermoelectric conversion material of this disclosure.

The production method of the n-type thermoelectric conversion material of this disclosure is not especially limited. The n-type thermoelectric conversion material can be produced using, for example, the following production method as depicted in FIG. 2.

(1) Desired amounts are first weighed of raw materials including desired elements of Zr, Hf, Nb, Ta, Ni, Cu, Pd, Pt, and Sb at the stoichiometric ratios (step P1). The composition ratios estimated from the weighed raw materials are referred to as "prepared composition". For example, the raw materials including: one or more element(s) (X) of Zr and Hf; one or more element(s) (X') of Nb and Ta; one or more element(s) (T) selected from Ni, Pd, and Pt, while including at least Ni; Cu; and Sb are weighed for the amounts corresponding to the stoichiometric ratios in the chemical formula $X_{3-x}X'_xT_{3-y}Cu_ySb_4$ (0≤x<3, 0≤y<3.0, and x+y>0).

(2) An alloy "A" is acquired by alloying the raw materials using an arc melting method for the raw materials including the desired elements of Zr, Hf, Nb, Ta, Ni, Pd, Pt, and Cu of the above. At this step, the alloy "A" is produced by applying arc electric discharge plasma to the raw materials placed on a hearth liner in an atmosphere replaced with an Ar gas to melt the raw materials at a high temperature equal to or higher than 2,200° C., and cooling the melted raw materials (step P2).

(3) An alloy "B" is produced by melting the acquired alloy "A" and the raw material including Sb at a low temperature of 1,200 to 1,500° C. in an Ar atmosphere using the arc melting method, and cooling the alloy and the raw material melted as above (step P3).

In the course of the melting to produce the alloy A and the alloy B, such methods are usable in addition to the arc melting method as a method of melting the raw materials by heating by a resistance heating element in a vacuum or in an inert atmosphere, and an induction heating method of melting the raw materials using a high frequency electromagnetic wave.

When the density of the alloy B is increased, a sintered object thereof is produced by using a spark plasma sintering method (an SPS method) (step P4). The SPS method is a sintering method characterized in that a specimen is heated by applying a pulse current thereto concurrently applying a pressure thereto.

(a) The alloy B is first pulverized and stirred using a mortar and a muddler, a ball mill method, etc., to acquire powder of the alloy B. The pulverization work is desirably executed in an inert atmosphere to avoid any oxidization of the powder. For example, a glove box may be used as a method to do the above.

(b) A graphite cylinder-like die having an outer diameter of 50 mm and an inner diameter of 10 mm is filled with the acquired powder of the alloy B, and this die is introduced into a vacuum of 1 Pa or lower. The die is not limited to the cylinder-like die.

(c) Applying a pressure of 50 MPa to the specimen covered by the die from above and underneath, a pulse current is caused to flow through the specimen through punches at the top and the bottom of the die to increase the temperature of the specimen up to 850° C. at a rate of temperature increase of about 100° C./min. After increasing the temperature up to 850° C., this temperature is maintained for five min.

(d) Thereafter, the specimen is cooled to the room temperature and, thereby, a compact sintered object can be acquired. At the sintering step, hot pressing is also usable instead of the SPS method. At the sintering step, a pressure in a range from 10 MPa to 100 MPa may be applied. A more compact sintered object can be acquired by applying a pressure in a range from 30 MPa to 100 MPa. The temperature may be increased to a temperature in a range from 750° C. to 900° C. The time period to maintain the above temperature may be, for example, a time period in a range from five min to 10 min.

The use as the n-type thermoelectric conversion material or measurement of the thermoelectric conversion physical property is enabled by processing the alloy B or its sintered object into an arbitrary shape and using the processed alloy B or processed its sintered object.

Example 1

Sintered objects of $X_{3-x}X'_xT_{3-y}Cu_ySb_4$ were produced according to the one example of the production method described in the first embodiment. The sintered objects were cut out in sizes suitable for the following measurement methods, and measurement sessions were executed on the thermal conductivity κ, the electric resistivity ρ, and the Seebeck coefficients S.

The measurement method of the thermal conductivity κ will be described. The thermal conductivity κ is acquired as expressed in κ=n*C*I using the density "n", the specific heat "C", and the thermal diffusion factor "I". An Archimedes method was used to measure the density n. Measurement using a laser flash method was executed using a measuring apparatus LFA457 manufactured by NETZSCH to acquire measured values of the thermal diffusion factor I and the specific heat C.

To execute the measurement for the thermal diffusion factor using the laser flash method, a sample was formed by cutting out the sintered object into a cylinder-like piece having a diameter of about 10 mm and a thickness of about 1 mm and applying a graphite coating on the front and the back faces thereof, and was introduced into an Ar atmosphere. The thermal diffusion factor I was acquired from the temporal variation of the temperature on the back face of the sample acquired when a laser beam was applied to the front face thereof. The laser flash method was also used in the measurement of the specific heat of the specimen, and a comparison method was used according to which the temporal variation of the temperature on the back face of the sample after the application of the laser beam was compared to that of the sample whose specific heat was known.

The measurement of the Seebeck coefficient S and the electric resistivity ρ was executed using a four-terminal method, and a measuring apparatus ZEM-3 manufactured by ULVAC Riko, Inc., was used in the measurement. The specimen was cut out into a rectangular parallelepiped of about 2 mm*2 mm*8 mm, and the measurement was executed in a helium atmosphere of 0.1 atmospheric pressure. An electric current was applied between the ends along a longer-side direction and probe electrodes were brought into contact with two points sandwiched between the ends along a longer-side direction. Thereby, the potential difference and the temperature difference between the probe electrodes were detected. The electric resistivity ρ was acquired by using a definitional equation ρ=ΔV/I*S/L from the applied current "I", the voltage "ΔV" between the probe electrodes, the cross-sectional area S of the specimen, and the interval L between the probe electrodes. The Seebeck coefficient S was acquired from the definitional equation S=−ΔV/ΔT from the ratio of the potential difference ΔV to the temperature difference ΔT.

Finally, the actual composition of the sintered object acquired according to the production procedure was analyzed using an Energy dispersive X-ray spectroscopy (EDX). The EDX method is a method of measuring the ratios of elements in the vicinity of the surface of the specimen from the energy distribution of the characteristic X-ray generated when an electron beam is applied to the specimen. The composition analysis was executed also in the conventional example using an electron probe micro analyzer (EPMA) that is a method equivalent to the above. In this measurement, the composition analysis was executed using the EDX method for different four points on the surface of the specimen, and the chemical composition was acquired from the average of the four points. According to Non-Patent Literature 1, the overall chemical composition is herein described for the abundance of Ni atoms to be uniformed to be described as "three" in the chemical formula. For a system at which Ni atoms are replaced, the ratios of the overall composition are described for the total of the number of atoms of Ni, Cu, Pd, and Pt including the replacing element to be "three" in the chemical formula.

For the specimens having the compositions, Table 1 shows the prepared composition, the actual composition, the maximal value $ZT_{max}$ of the performance index ZT of the thermoelectric conversion acquired using the above measurement method, the temperature $T_{max}$ thereof, and the Seebeck coefficient at $T_{max}$. FIG. 3 is a graph of Cu replacement amount dependency of the maximal value $ZT_{max}$ of the performance index of $X_3T_{3-y}Cu_ySb_4$ that is a thermoelectric conversion material of this disclosure. FIG. 4 is a graph of the Cu replacement amount dependency of the Seebeck coefficient at the temperature $T_{max}$ at which the performance index becomes maximal of $X_{3-x}X'_xT_{3-y}Cu_ySb_4$ that is the thermoelectric conversion material of this disclosure. The Cu replacement amount y in FIG. 3 and FIG. 4 is the Cu replacement amount in the prepared composition.

Figure 5:
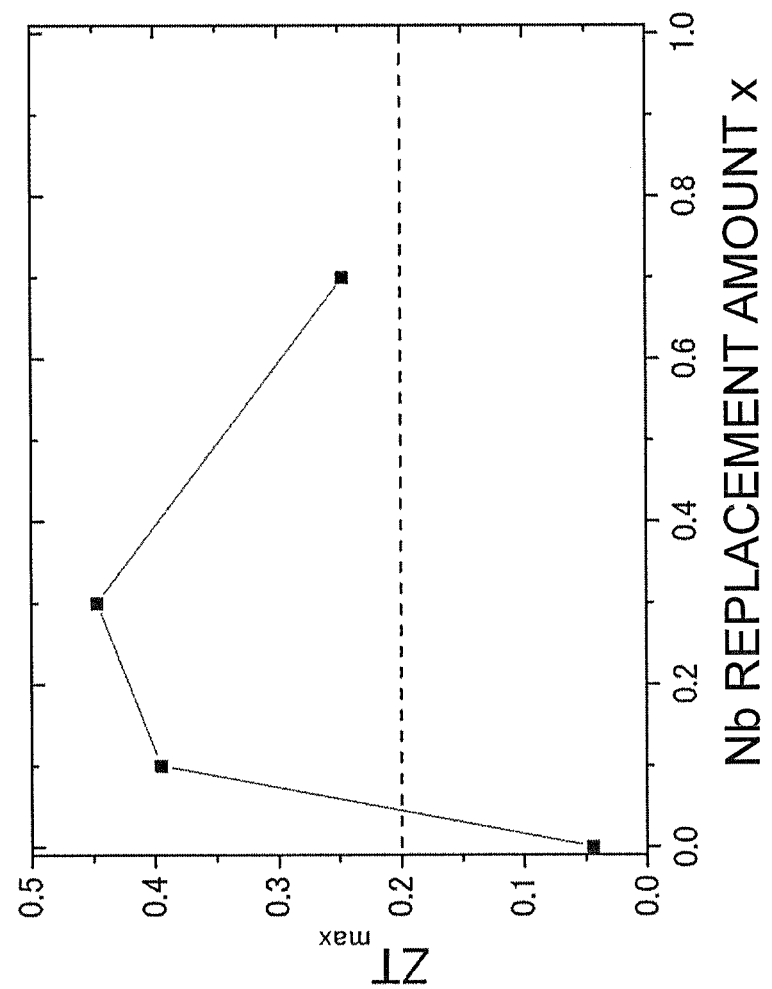
FIG. 5 is a graph of Nb replacement amount dependency of the maximal value ZT$_{max}$ of the performance index of X$_{3-x}$Nb$_x$Ni$_3$Sb$_4$ that is the thermoelectric conversion material of this disclosure.
Figure 6:
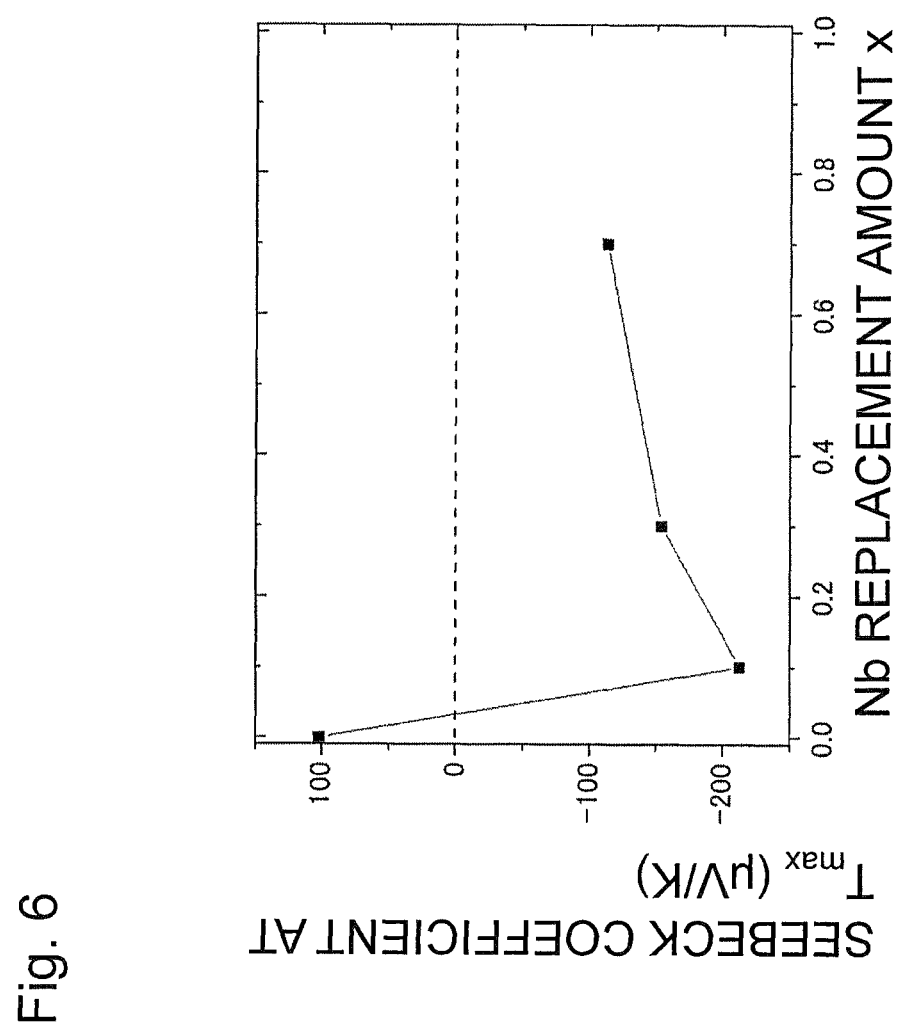
FIG. 6 is a graph of Nb replacement amount dependency of the Seebeck coefficient at the temperature T$_{max}$ at which the performance index becomes maximal of X$_{3-x}$Nb$_x$Ni$_3$Sb$_4$ that is the thermoelectric conversion material of this disclosure.

FIG. 5 is a graph of Nb replacement amount dependency of the maximal value $ZT_{max}$ of the performance index of $X_{3-x}Nb_xNi_3Sb_4$ that is a thermoelectric conversion material of this disclosure. FIG. 6 is a graph of the Nb replacement amount dependency of the Seebeck coefficient at the temperature $T_{max}$ at which the performance index becomes maximal of $X_{3-x}Nb_xNi_3Sb_4$ that is the thermoelectric conversion material of this disclosure. The Nb replacement amount x in FIG. 5 and FIG. 6 is the Nb replacement amount in the prepared composition.

Figure 7:
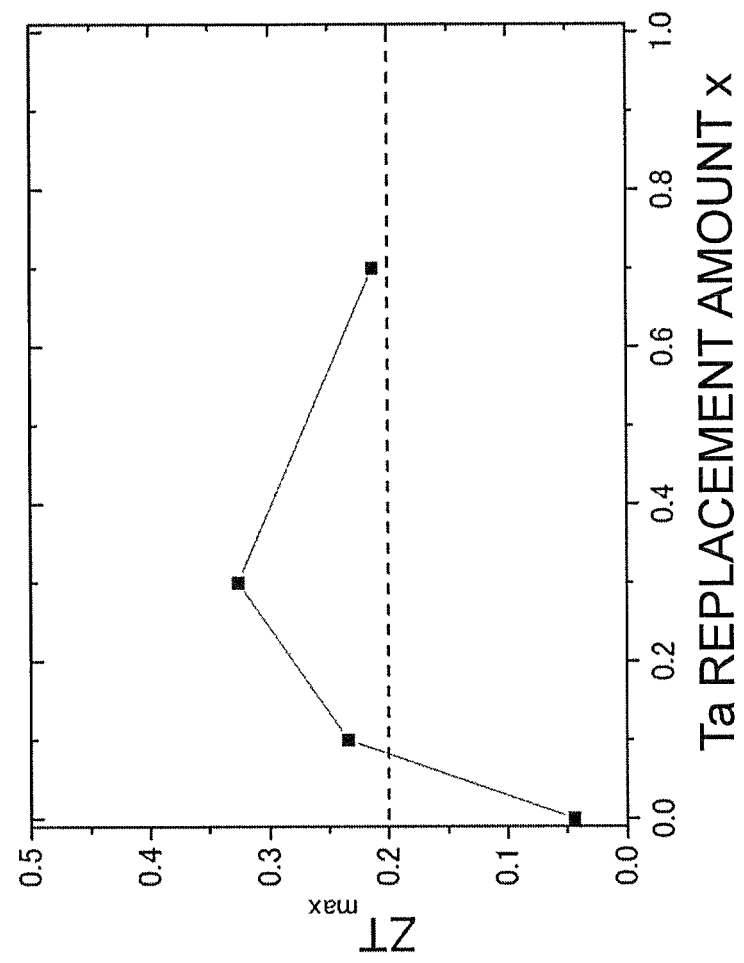
FIG. 7 is a graph of Ta replacement amount dependency of the maximal value ZT$_{max}$ of the performance index of X$_3$Ta$_x$Ni$_3$Sb$_4$ that is the thermoelectric conversion material of this disclosure.
Figure 8:
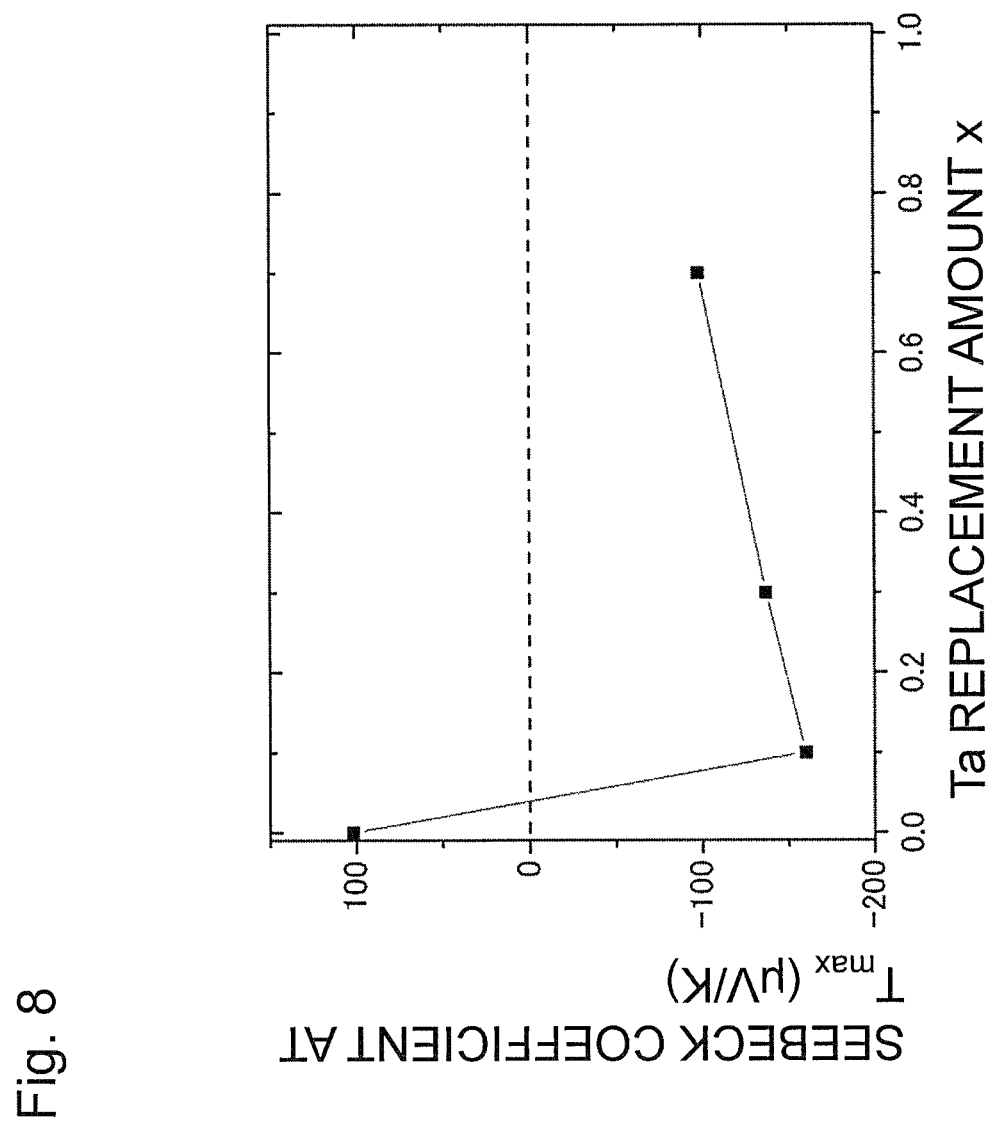
FIG. 8 is a graph of Ta replacement amount dependency of the Seebeck coefficient at the temperature T$_{max}$ at which the performance index becomes maximal of X$_{3-x}$Ta$_x$Ni$_3$Sb$_4$ that is the thermoelectric conversion material of this disclosure.

FIG. 7 is a graph of Ta replacement amount dependency of the maximal value $ZT_{max}$ of the performance index of $X_{3-x}Ta_xNi_3Sb_4$ that is a thermoelectric conversion material of this disclosure. FIG. 8 is a graph of the Ta replacement amount dependency of the Seebeck coefficient at the temperature $T_{max}$ at which the performance index becomes maximal of $X_{3-x}Ta_xNi_3Sb_4$ that is the thermoelectric conversion material of this disclosure. The Ta replacement amount x in FIG. 7 and FIG. 8 is the Ta replacement amount in the prepared composition.

TABLE 1

|  | Prepared Composition | Actual Composition | Maximal Performance Index $ZT_{max}$ (Temperature $T_{max}$ thereof) | Seebeck Coefficient at $T_{max}$ (μV/K) |
| --- | --- | --- | --- | --- |
| Example 1 | $Zr_3Ni_{2.9}Cu_{0.1}Sb_4$ | $Zr_{3.12}Ni_{2.94}Cu_{0.06}Sb_{4.03}$ | 0.203(810 K) | −141 |
| Example 2 | $Zr_3Ni_{2.8}Cu_{0.2}Sb_4$ | $Zr_{3.04}Ni_{2.79}Cu_{0.21}Sb_{3.98}$ | 0.374(710 K) | −162 |
| Example 3 | $Zr_3Ni_{2.7}Cu_{0.3}Sb_4$ | $Zr_{3.17}Ni_{2.64}Cu_{0.36}Sb_{3.94}$ | 0.412(670 K) | −160 |
| Example 4 | $Zr_3Ni_{2.5}Cu_{0.5}Sb_4$ | $Zr_{2.98}Ni_{2.51}Cu_{0.49}Sb_{4.19}$ | 0.408(660 K) | −128 |
| Example 5 | $Zr_3Ni_{2.3}Cu_{0.7}Sb_4$ | $Zr_{2.99}Ni_{2.28}Cu_{0.72}Sb_{4.03}$ | 0.290(670 K) | −102 |
| Example 6 | $Zr_3Ni_2CuSb_4$ | $Zr_{2.95}Ni_{2.04}Cu_{1.06}Sb_{3.93}$ | 0.144(660 K) | −62 |
| Comparative Example 1 | $Zr_3Ni_3Sb_4$ | $Zr_{3.07}Ni_3Sb_{4.14}$ | 0.044(570 K) | 102 |
| Reference Example | $Zr_3Ni_{2.9}Co_{0.1}Sb_4$ | $Zr_{2.78}Ni_{2.91}Co_{0.09}Sb_{3.78}$ | 0.519(710 K) | 152 |
| Example 7 | $Zr_3Ni_{2.4}Pd_{0.3}Cu_{0.3}Sb_4$ | $Zr_{2.83}Ni_{2.38}Pd_{0.27}Cu_{0.35}Sb_{3.89}$ | 0.474(670 K) | −158 |
| Example 8 | $Zr_3Ni_{2.4}Pt_{0.3}Cu_{0.3}Sb_4$ | $Zr_{3.02}Ni_{2.32}Pt_{0.34}Cu_{0.34}Sb_{3.84}$ | 0.413(670 K) | −174 |
| Example 9 | $Zr_2HfNi_{2.7}Cu_{0.3}Sb_4$ | $Zr_{2.05}Hf_{0.94}Ni_{2.69}Cu_{0.31}Sb_{3.94}$ | 0.384(710 K) | −171 |
| Example 10 | $ZrHf_2Ni_{2.7}Cu_{0.3}Sb_4$ | $Zr_{1.06}Hf_{2.03}Ni_{2.72}Cu_{0.28}Sb_{4.03}$ | 0.378(660 K) | −164 |
| Example 11 | $Hf_3Ni_{2.7}Cu_{0.3}Sb_4$ | $Hf_{3.03}Ni_{2.68}Cu_{0.32}Sb_{3.89}$ | 0.420(660 K) | −168 |
| Example 12 | $Zr_{2.9}Nb_{0.1}Ni_3Sb_4$ | $Zr_{2.76}Nb_{0.07}Ni_3Sb_{4.11}$ | 0.395(760 K) | −213 |
| Example 13 | $Zr_{2.7}Nb_{0.3}Ni_3Sb_4$ | $Zr_{2.64}Nb_{0.27}Ni_3Sb_{3.99}$ | 0.447(670 K) | −154 |

TABLE 1-continued

| | Prepared Composition | Actual Composition | Maximal Performance Index $ZT_{max}$ (Temperature $T_{max}$ thereof) | Seebeck Coefficient at $T_{max}$ (μV/K) |
|---|---|---|---|---|
| Example 14 | $Zr_{2.3}Nb_{0.7}Ni_3Sb_4$ | $Zr_{2.31}Nb_{0.67}Ni_3Sb_{4.05}$ | 0.274(670 K) | −113 |
| Example 15 | $Zr_{2.9}Ta_{0.1}Ni_3Sb_4$ | $Zr_{2.92}Ta_{0.12}Ni_3Sb_{3.98}$ | 0.234(760 K) | −160 |
| Example 16 | $Zr_{2.7}Ta_{0.3}Ni_3Sb_4$ | $Zr_{2.66}Ta_{0.31}Ni_3Sb_{4.03}$ | 0.326(670 K) | −137 |
| Example 17 | $Zr_{2.3}Ta_{0.7}Ni_3Sb_4$ | $Zr_{2.27}Ta_{0.74}Ni_3Sb_{3.92}$ | 0.213(660 K) | −98 |
| Example 18 | $Zr_{2.7}Nb_{0.15}Ni_{2.85}Cu_{0.15}Sb_4$ | $Zr_{2.64}Nb_{0.12}Ni_{2.87}Cu_{0.13}Sb_{4.02}$ | 0.428(670 K) | −167 |
| Example 19 | $Zr_{2.7}Ta_{0.15}Ni_{2.85}Cu_{0.15}Sb_4$ | $Zr_{2.71}Ta_{0.13}Ni_{2.85}Cu_{0.15}Sb_{3.05}$ | 0.378(660 K) | −141 |

Examples 1 to 6 were specimens each formed by replacing Ni in $Zr_3Ni_3Sb_4$ with Cu, and Table 1 shows for each thereof the maximal value of the performance index ZT, the temperature at which the maximal value is achieved, and the Seebeck coefficient at the temperature. As shown in Table 1, the n-type thermoelectric conversion property was able to be acquired by the Cu replacement and a significant increased was observed of the performance index ZT compared to that of Comparative Example 1 that had no Cu introduced therein. As shown in Table 1 and as depicted in FIG. 3, especially, the performance index ZT took its maximal value for the Cu replacement amount y that was y=0.3. For the temperature, the performance index ZT achieved a high value of 0.412 at a high temperature of 670K.

Reference Example was a specimen formed by replacing with Co instead of Cu. Table 1 shows $ZT_{max}$ of Reference Example and the Seebeck coefficient at $T_{max}$ thereof. Reference Example was able to realize a high performance index ZT of 0.519 while showing a positive Seebeck coefficient. Reference Example was a thermoelectric conversion material showing the p-type thermoelectric conversion property.

Examples 7 and 8 were specimens each formed by further replacing with Pd or Pt, Ni of $Zr_3Ni_{2.9}Cu_{0.3}Sb_4$ that provided the optimal performance index ZT. Table 1 shows the performance indexes ZT of Examples 7 and 8. It was therefore able to be confirmed that the Cu replacement of Ni was essential while a higher performance index ZT was able to be realized by adding Pd or Pt.

Such Examples were compared with each other especially at the maximal value of the output factor PF as Example 3 that realized the highest values of the performance index ZT and the output factor PF under the condition for the n-type thermoelectric conversion property to be shown and Reference Example that realized the highest values of the performance index ZT and the output factor PF under the condition for the p-type thermoelectric conversion property to be shown. As a result, PF was PF=2.05 mW/(m·K²) at 520K for the n-type thermoelectric conversion material having Cu introduced therein (Example 3) and this PF was higher than the highest value of PF to be PF=1.76 mW/(m·K²) (570K) of the p-type thermoelectric conversion material having Co introduced therein (Reference Example).

Examples 9 to 11 in Table 1 were specimens each formed by replacing with Hf, Zr in $Zr_3Ni_{2.9}Cu_{0.1}Sb_4$ that provided the optimal performance index ZT. Table 1 shows the performance indexes ZT and the Seebeck coefficients of Examples 9 to 11. As shown in Table 1 for Examples 9 to 11, it was able to be confirmed that not only with $Zr_3Ni_3Sb_4$ and $Hf_3Ni_3Sb_4$ whose presence was already reported but also with $Zr_{3-x}Hf_xNi_3Sb_4$ that was an alloy of the above two, a high performance index ZT was realizable that was higher than 0.3 by the Cu replacement of Ni.

Examples 12 to 14 were specimens each formed by replacing Zr in $Zr_3Ni_3Sb_4$ with Nb, and Table 1 shows the performance indexes ZT and the Seebeck coefficients thereof. As shown in Table 1 and as depicted in FIG. 6, the n-type thermoelectric conversion property was acquired by the Nb replacement and a significant increase of the performance indexes ZT was observed compared to Comparative Example 1 having no Nb introduced therein. As shown in Table 1 and as depicted in FIG. 5, especially, the performance index ZT took its maximal value for the Nb replacement amount x that was x=0.3. For the temperature, the performance index ZT showed a high value of 0.447 at a high temperature of 670K.

Examples 15 to 17 were specimens each formed by replacing Zr in $Zr_3Ni_3Sb_4$ with Ta, and Table 1 shows the performance indexes ZT and the Seebeck coefficients thereof. As shown in Table 1 and as depicted in FIG. 8, the n-type thermoelectric conversion property was acquired by the Ta replacement and a significant increase of the performance indexes ZT was observed compared to Comparative Example 1 having no Ta introduced therein. As shown in Table 1 and as depicted in FIG. 7, especially, the performance index ZT took its maximal value for the Ta replacement amount x that was x=0.3. For the temperature, the performance index ZT showed a high value of 0.326 at the high temperature of 670K.

Examples 18 and 19 were specimens each formed by replacing Zr in $Zr_3Ni_3Sb_4$ with Nb or Ta and further replacing Ni therein with Cu. Table 1 shows the performance indexes ZT and the Seebeck coefficients thereof. As shown in Table 1, high ZTs were acquired similarly to the case where the replacement was executed using each of Nb, Ta, and Cu solely. This fact showed that the replacement for Zr and the replacement for Ni may be combined with each other and that the total amount "x+y" of the replaced Nb, Ta, and Cu was correlated with the thermoelectric conversion property.

As above, according to the thermoelectric conversion material expressed in the chemical formula $X_{3-x}X'_xT_{3-y}Cu_ySb_4$ (0≤x<3, 0≤y<3.0, x+y>0, X includes the one or more element(s) of Zr and Hf, X' includes the one or more element(s) of Nb and Ta, and T includes the one or more element(s) selected from Ni, Pd, and Pt, while including at least Ni) of this disclosure, the n-type thermoelectric conversion property can be realized by replacing Ni with Cu in the predetermined range (0<y<3.0) or replacing X with Nb or Ta in the predetermined range (0<x<3.0). For example, as shown in Table 1 and as depicted in FIG. 4, it was confirmed that the n-type thermoelectric conversion property was able to be acquired by setting the value of y to be in the range 0.05≤y≤1.1. Taking into consideration the Cu replacement amount dependency of the performance index ZT depicted in FIG. 3 and the Cu replacement amount dependency of the Seebeck coefficient depicted in FIG. 4, the n-type thermoelectric conversion property, the high performance index, and the Seebeck coefficient having a great absolute value can concurrently be realized by setting the value of y to be in the range 0.05≤y≤0.7. The higher performance index and the Seebeck coefficient having a greater absolute value can be acquired by setting the value of y to be in the range 0.2≤y≤0.5. The value of y is the Cu replacement amount in the actual composition. The n-type thermoelectric conversion property was acquired by setting the range of Nb or Ta to be 0.05≤y≤0.7.

The $(Zr,Hf)_3Ni_3Sb_4$-based n-type thermoelectric conversion material according to this disclosure is usable to constitute a device that executes thermoelectric generation or thermoelectric cooling.

EXPLANATIONS OF LETTERS OR NUMERALS 11 atomic position (black) of X=Zr,Hf in an $X_{3-x}X'_xT_{3-y}Cu_ySb_4$ crystal
12 atomic position (gray) of T=Ni, Pd, Pt, or Cu in the $X_{3-x}X'_xT_{3-y}Cu_ySb_4$ crystal
13 atomic position (white) of Sb in the $X_{3-x}X'_xT_{3-y}Cu_ySb_4$ crystal

The invention claimed is:

1. An n-type thermoelectric conversion material expressed in a chemical formula $X_{3-x}X'_xT_{3-y}Cu_ySb_4$ (0≤x<3, 0≤y<3.0, and x+y>0), wherein
the X comprises one or more element(s) of Zr and Hf,
the X' comprises one or more element(s) of Nb and Ta,
the T comprises one or more element(s) selected from Ni, Pd, and Pt, while including at least Ni, and
the material expressed in the chemical formula $X_{3-x}X'_xT_{3-y}Cu_ySb_4$ has symmetry of a cubic crystal belonging to a space group I-43d.

2. The n-type thermoelectric conversion material according to claim 1, wherein a total of the x and the y is in a range 0.055≤x+y≤1.1.

3. The n-type thermoelectric conversion material according to claim 1, wherein the total of the x and the y is in a range 0.05≤x+y≤0.7.

4. The n-type thermoelectric conversion material according to claim 1, wherein the total of the x and the y is in a range 0.2≤x+y≤0.5.

5. The n-type thermoelectric conversion material of according to claim 1, wherein the x is zero.

6. A production method of an n-type thermoelectric conversion material, comprising:
(1) a first step of weighing raw materials comprising one or more element(s) (X) of Zr and Hf, one or more element(s) (X') of Nb and Ta, and one or more element(s) (T) selected from Ni, Pd, and Pt, while including at least Ni, Cu, and Sb for amounts corresponding to stoichiometric ratios in a chemical formula $X_{3-x}X'_xT_{3-y}Cu_ySb_4$ (0≤x<3, 0≤y<3, and x+y>0), the material expressed in the chemical formula $X_{3-x}X'_xT_{3-y}Cu_ySb_4$ having symmetry of a cubic crystal belonging to a space group I-43d;
(2) a second step of acquiring an alloy "A" by alloying the raw materials that comprise the selected elements of Zr,Hf, Nb, Ta, Ni, Pd, Pt, and Cu; and
(3) a third step of acquiring the n-type thermoelectric conversion material that comprises an alloy B, by melting and cooling the acquired alloy A and the raw material comprising Sb.

7. The production method of an n-type thermoelectric conversion material according to claim 6, wherein the third step is executed at a temperature lower than a temperature at which the second step is executed.

8. The production method of an n-type thermoelectric conversion material according to claim 6, wherein at the second step, the alloy A is acquired by melting the raw materials at a temperature equal to or higher than 2,200° C. in an Ar atmosphere using an arc melting method and cooling the melted raw materials therein.

9. The production method of an n-type thermoelectric conversion material according to claim 6, wherein at the third step, the alloy B is acquired by melting the alloy A and the raw material comprising Sb at a temperature from 1,200 to 1,500° C. in an Ar atmosphere using the arc melting method, and cooling the melted alloy A and the raw material therein.

10. The production method of an n-type thermoelectric conversion material according to claim 6, further comprising a fourth step of compacting the alloy B.

11. The production method of an n-type thermoelectric conversion material according to claim 10, wherein the fourth step comprises:
(a) acquiring powder of the alloy B by pulverizing the alloy B and mixing;
(b) filling a die with the powder of the alloy B and introducing the die into a vacuum of one Pa or lower;
(c) applying a pressure in a range from 10 MPa to 100 MPa to a specimen covered by the die from above and underneath and increasing a temperature of the specimen up to a temperature in a range from 750° C. to 900° C. maintaining the pressure; and
(d) cooling the specimen to a room temperature.

12. The production method of an n-type thermoelectric conversion material of according to claim 6, wherein the x is zero.

* * * * *